United States Patent [19]
Kawaguchi et al.

[11] Patent Number: 6,051,062
[45] Date of Patent: Apr. 18, 2000

[54] OPTICAL SINGLE CRYSTAL FILM, PROCESS FOR PRODUCING THE SAME AND OPTICAL ELEMENT COMPRISING THE SAME

[75] Inventors: Tatsuo Kawaguchi, Gifu Pref.; Minoru Imaeda, Nagoya, both of Japan

[73] Assignee: NGK Insulators, Ltd., Nagoya, Japan

[21] Appl. No.: 08/968,264

[22] Filed: Nov. 12, 1997

[30] Foreign Application Priority Data

Dec. 27, 1996 [JP] Japan .................................. 8-350104

[51] Int. Cl.$^7$ .................................................. C30B 33/06
[52] U.S. Cl. ................................ 117/3; 117/11; 117/54; 117/73; 117/906; 117/918; 117/948
[58] Field of Search ........................ 117/54, 73, 906, 117/918, 2, 3, 948; 252/584

[56] References Cited

U.S. PATENT DOCUMENTS

| | | | |
|---|---|---|---|
| 3,607,752 | 9/1971 | Erlenbach | 252/62.9 |
| 3,867,185 | 2/1975 | Primak . | |
| 4,196,963 | 4/1980 | Chen et al. . | |
| 4,640,736 | 2/1987 | Holman | 156/603 |
| 5,209,917 | 5/1993 | Ohno et al. | 423/592 |
| 5,426,310 | 6/1995 | Tamada et al. | 252/584 |

FOREIGN PATENT DOCUMENTS

| | | |
|---|---|---|
| 0407945 | 7/1990 | Japan . |
| 0676490 | 3/1995 | Japan . |

OTHER PUBLICATIONS

Yamada, A., Tamada, H., Saitoh, M., "Liquid Phase Epitaxial Growth of LiNbO3 Thin Film Using Li2O–B2O3 Flux Sysytem," Journal of Crystal Growth, vol. 132 (1993), pp. 48–60, 1993.

Primary Examiner—Benjamin L. Utech
Assistant Examiner—Matthew Anderson
Attorney, Agent, or Firm—Wall Marjama Bilinski & Burr

[57] ABSTRACT

In producing an optical single crystal epitaxial film from a melt containing a transition metal on a single crystal substrate by a liquid phase epitaxial method, this process contains the steps of: annealing the film at a predetermined temperature in an ozonic atmosphere; and temperature-increasing and -decreasing to and from the predetermined temperature, wherein at least one of temperature-increasing and -decreasing steps, the film is exposed to a substantially ozone-free atmosphere.

6 Claims, 4 Drawing Sheets

OPTICAL SINGLE CRYSTAL FILM, PROCESS FOR PRODUCING THE SAME AND OPTICAL ELEMENT COMPRISING THE SAME

BACKGROUND OF THE INVENTION

The present invention relates to an optical single crystal film, a process for producing the same and an optical element comprising the same.

Description of Related Art

It is well-known to develop blue laser light sources for optical recording and reading-out with a high density, for example, second-harmonic generation (SHG) devices using a lithium niobate or lithium tantalate single crystal.

For example, according to "Journal of Applied Physics" Vol. 70, No.5, p.2536–2541, (September 1991), there is disclosed the formation of a lithium niobate film on a MgO doped lithium niobate substrate by means of a liquid phase epitaxial process using $Li_2O$—$V_2O_5$ flux. The optical propagation loss of this film, however, is extremely large, for example, as large as 25 dB/cm at a green light of 514.5 nm wavelength. This defect is attributable to optical absorption caused by a V ion introduced into the film from the flux. It further describes that in order to decrease the optical absorption caused by the V ion, it is necessary to change the valence number of V ion from +3 to +5. To accomplish this, an ozone annealing treatment is employed. Especially, it reports that the optical propagation loss at the green light of 514.5 nm wavelength can be improved to 1.6 dB/cm, by annealing a once produced lithium niobate film at 600° C. for an hour in an ozonic atmosphere. However, it also discloses that even with the ozone annealing treatment, the optical propagation loss is at least 10 dB/cm, for example, in the case of a blue beam of 450 nm wavelength.

According to, the "Journal of Crystal Growth" 132 (1993), p.48–60, a lithium niobate film is formed by means of a liquid phase epitaxial process using $Li_2O$—$V_2O_5$ flux and subjected to an ozone annealing treatment. Although this process highly improves an optical absorption in a green light range, the effect is not sufficient in a blue light range with shorter wavelengths. Accordingly, in order to use the film in a blue light range, it is effective to form a lithium niobate film by using, for example, a $Li_2O$—$B_2O_3$ flux that is free from transition metal elements such as V and the like causing the absorption.

According to "Journal of Applied Physics" Vol.67, No.2, 15, (January 1990) p.949–954, a Bi-substituted magnetic garnet is formed by means of a liquid phase epitaxial process using a $Bi_2O_3$ flux. The Bi-substituted magnetic garnet is then subjected to an ozone annealing treatment, for example, at 700° C. for three hours and thereafter to an oxygen annealing treatment at 500° C. to decrease the optical propagation loss at a 1.3 μm wavelength to 1 dB/cm or less.

As mentioned above, in either "Journal of Applied Physics" Vol.70, No.5 (September 1991) or "Journal of Crystal Growth" 132 (1993) p.48–60, they failed to sufficiently decrease the optical absorption in the blue light range.

Additionally, the description of "Journal of Applied Physics" Vol.67, No.2, p.15 relates to the decrease of the optical absorption in an infrared range of, for example, 1.3–1.5 μm wavelengths and not to the decrease of the optical absorption in the blue light range of 400–500 nm wavelengths.

SUMMARY OF THE INVENTION

It is, therefore, an object of the present invention to decrease an absorption coefficient for a light in a blue light range of, for example, 400–500 nm wavelengths, when an optical single crystal film is manufactured by means of a liquid phase epitaxial process from a melt containing a transition metal.

According to the first aspect of the invention there is a provision of a process for manufacturing an optical single crystal film on a single crystal substrate which comprises the steps of:

liquid phase epitaxial growing for forming an optical single crystal epitaxial film from a melt containing a transition metal on a single crystal substrate;

increasing a temperature of the epitaxial film up to a predetermined temperature;

annealing said epitaxial film at said predetermined temperature in an atmosphere which contains ozone; and decreasing the temperature of the epitaxial film from said predetermined temperature;

which process is characterized by exposing said epitaxial film to an atmosphere substantially free from ozone in at least one step of increasing and decreasing the temperature.

The present inventors have conceived that in forming an epitaxial film by means of an liquid phase epitaxial process and subjecting the epitaxial film to an ozone annealing treatment, an atmosphere substantially free from ozone is run around the epitaxial film in at least one step of increasing the temperature to an annealing temperature and decreasing the temperature from the annealing temperature. As the result, they have found that an absorption coefficient for a light in blue light range of 400–500 nm wavelengths is extremely decreased and have reached the present invention.

In has been found that the effect in decreasing the optical absorption coefficient by ozone annealing unexpectedly occurs only when the annealing temperature is within a predetermined temperature range, and if an ozone annealing time is prolonged, the optical absorption coefficient is unexpectedly increased as crystallinity deteriorates. In the temperature-increasing step and temperature-decreasing step before and after the ozone annealing step within the predetermined temperature range, the effect in decreasing the optical absorption coefficient is poor and rather it is likely that the optical absorption coefficient will increase as the crystallinity deteriorates. In the present invention, a substantially ozone-free atmosphere is used during a temperature-increasing step or temperature-decreasing step, such that an ozone annealing treatment which most improves the optical absorption coefficient can be realized.

It is conjectured that this is because the annealing temperature in an ozonic atmosphere can be increased and at the same time the ozone annealing time can be decreased.

Ozone has a property of self-decomposition. The degree of the self-decomposition of ozone extremely changes with changes of temperature, pressure, structure of apparatuses and the like. Therefore, since an ozone concentration in the actual annealing atmosphere surrounding the epitaxial film extremely changes, it is difficult to define the ozone concentration. Accordingly, in the present invention, the ozone concentration in the ozonic atmosphere just before being supplied around the epitaxial film will be mentioned.

The ozone concentration in the ozonic atmosphere is preferably at least 0.1% and maximally 100%, by volume. However, since actually an atmosphere containing both the ozone and oxygen is easily available, the ratio of the ozone in the ozone/oxygen-containing atmosphere is preferable to be 0.1–50% by volume. Moreover, it is possible to mix the ozone/oxygen-containing atmosphere with an inert gas carrier. In this case, the mix ratio of the ozone/oxygen-containing atmosphere with the inert gas is preferably 100:1–1:10. As the inert gas, nitrogen, argon, etc., are preferred.

In the present invention, the ozone concentration in "substantially ozone-free atmosphere" is defined to be not more than 0.1 ppm by volume. This atmosphere is preferably an inert gas atmosphere such as nitrogen, argon and the like.

Furthermore, in each of the temperature-increasing, temperature-decreasing and ozone annealing steps, the water vapor in the atmosphere is desired to be in a concentration of not less than 0.01% by volume. When the water vapor concentration is less than 0.01% by volume, it is not practical, because the degradation of the substrate is increased owing to, for example, the drawing out of Li from lithium niobate. From this point of view, the water vapor is more preferably in a concentration of not less than 0.1% by volume.

In the ozone annealing step, the water vapor in the atmosphere is particularly preferable to be in a concentration of not more than 5% by volume. When the water vapor concentration is more than 5% by volume, the degradation rate of ozone is so increased that the ozone to effectively act on the epitaxial film is decreased with the consequence that the improvement of the optical absorption characteristics is liable to be insufficient. From this point of view, it is more preferable that the water vapor is within a concentration of not more than 3% by volume.

Furthermore, in the temperature-increasing and temperature-decreasing steps, the water vapor in the atmosphere is particularly preferable to be in a concentration of not more than 5% by volume. When the water vapor concentration is more than 5% by volume, the dew point becomes at least 30° C. which is higher than the ordinary room temperature (about 20–25° C.) and, therefore, the water vapor is condensed into liquid water in a pipe-line to the annealing furnace. Accordingly, the water vapor concentration fluctuates so much that it is difficult to anneal with a good reproducibility. From this point of view, the water vapor is more preferable within a concentration of not more than 3% by volume.

The water vapor concentration in the ozonic atmosphere is preferably lower than that in the substantially ozone-free atmosphere. As a result, the optical absorption coefficient of the optical single crystal film is further decreased. In this case, the difference in the water vapor concentrations between both the atmospheres is preferred to be at least 2% by volume.

In the present invention, as an optical single crystal composing the epitaxial film, a lithiumniobate single crystal, lithium tantalate single crystal, $LiNb_xTa_{1-x}O_3$ single crystal (0<x<1), $K_3Li_2Nb_5O_{15}$ and $K_3Li_2 (Nb, Ta)_5O_{15}$ are preferable.

As a transition metal contained in the melt, V, Nb, Ta, Fe, Ti, Co, Ni, Mn, Cr, Mo and W are preferable.

The process for forming an optical single crystal film on a single crystal substrate, particularly on an oxide single crystal substrate, by means of an epitaxial growth method is not particularly limited. However, the process disclosed in Japanese Patent Application Opened No. 7-311,370 is preferred.

In this manufacturing process, a solute and a solvent are charged in a crucible and mixed together, the mixture is kept at a higher temperature than the saturated temperature and the solute and the solvent are homogeneously melted. Subsequently, the melt is cooled to a solid-depositing temperature lower than the saturated temperature. The melt is in the supercooled state at first. However, when it is kept at this temperature for a sufficiently long period of time, a solid phase is deposited from the melt, and the melt is separated into liquid and solid phases. Then, the temperature of the melt is decreased to bring the liquid phase to a supercooled state. The substrate is contacted with the supercooled liquid to epitaxially grow a single crystal film thereon.

In the step of the epitaxial growth, if the solute is at least one compound selected from the group consisting of lithium niobate, lithium tantalate and $LiNb_xTa_{1-x}O_3$, the solvent is preferable to be $LiVO_3$. This is because a flux containing $LiVO_3$ is easier to use and higher in crystallinity of the epitaxial film, and provides a film with a flat surface.

For this reason, the melt containing $V_2O_5$ and $Li_2O$ as main ingredients and besides a transition metal is preferably used. In this case, can be obtained an optical single crystal film with an absorption coefficient for a light of 450 nm wavelength being not more than 2.0 $cm^{-1}$ or further not more than 1.1I $cm^{-1}$.

In the present invention, in order to obtain a second harmonic generating element to be used as a blue light source, an optical waveguide with a periodic domain inversion structure can be formed on a substrate consisting of an electrooptical single crystal of a lithium niobate or the like. A semi-conductor laser beam of an infrared wavelength is introduced to the optical waveguide to obtain a blue light (U.S. Pat. No. 4,740,265, and Japanese Patent Application Opened No. 5-289131 and 5-173213).

Particularly, according to the invention there can be a provision of an optical element which comprises a ferroelectric optical single crystal substrate subjected to a single poling treatment and a ferroelectric optical single crystal film grown epitaxially in a liquid phase from a melt containing a transition element on the ferroelectric optical single crystal substrate and annealed in an ozonic atmosphere, wherein the above film has an extraordinary index larger than that of the substrate and an optical propagation loss at a 450 nm wavelength of not more than 5 dB/cm.

Such a second harmonic generating element can be extensively applied in uses for an optical disc pick up, optical disc memory, medicine, opticalchemistry, various optical measurements and the like.

BRIEF DESCRIPTION OF THE DRAWINGS

The invention will be described with reference to the accompanying drawings, wherein.

DESCRIPTION OF THE PREFERRED EMBODIMENTS

Further concrete experimental results are described below.

EXAMPLE 1

A lithium niobate film was formed on the surface of a substrate consisting of a lithium niobate single crystal by means of a liquid phase epitaxial process. As the substrate, an optical grade lithium niobate single crystal wafer of 3 inches in diameter was used. A half-width of an X-ray rocking curve with respect to the substrate was 6.8–6.9 [arc sec].

The film was formed by means of a horizontal dipping method on the substrate which was held with platinum holders at three peripheral points. A melt of $Li_2O:Nb_2O_5:V_2O_5$ 50 mol %:10 mol %:40 mol % was used. The melt was kept at a temperature between 1000° C. and 1300° C. and dissolved into complete homogeneous state. Then the melt was cooled to 905° C. and kept for 24 hours or more. During this period, a supersaturated $LiNbO_3$ was separated as a solid phase and the liquid phase became a perfect saturated state.

Then, adjusting the temperature of the melt at 900° C., the above substrate was immersed into the liquid phase and a single crystal film was formed. The period of time the substrate was contacted with the melt was 20 minutes. Next, the substrate was pulled up. The single crystal film had a thickness of 20 μm and a composition of $LiNbO_3$.

The thus manufactured sample was subjected to an annealing treatment according to the following procedures. Namely, the sample was set in an electric furnace at room temperature. Then, while nitrogen dried to contain water vapor in a concentration of 0.01% was run into the electric furnace, the temperature was increased to each of the annealing temperatures shown in Table 1 at a temperature-increasing rate of 300° C./hour. When the temperature had reached a predetermined annealing temperature, the gas running into the furnace was changed to oxygen which contained about 4% by volume of ozone and was dried to contain water vapor in a concentration of 0.01% by volume. In this condition, the annealing treatment was conducted for three hours in the ozonic atmosphere.

Then, the atmospheric gas running into the electric furnace was changed to nitrogen gas dried to contain water vapor in a concentration of 0.01% by volume and the sample was cooled to room temperature at a temperature-decreasing rate of 300° C./hour.

Figure 1:
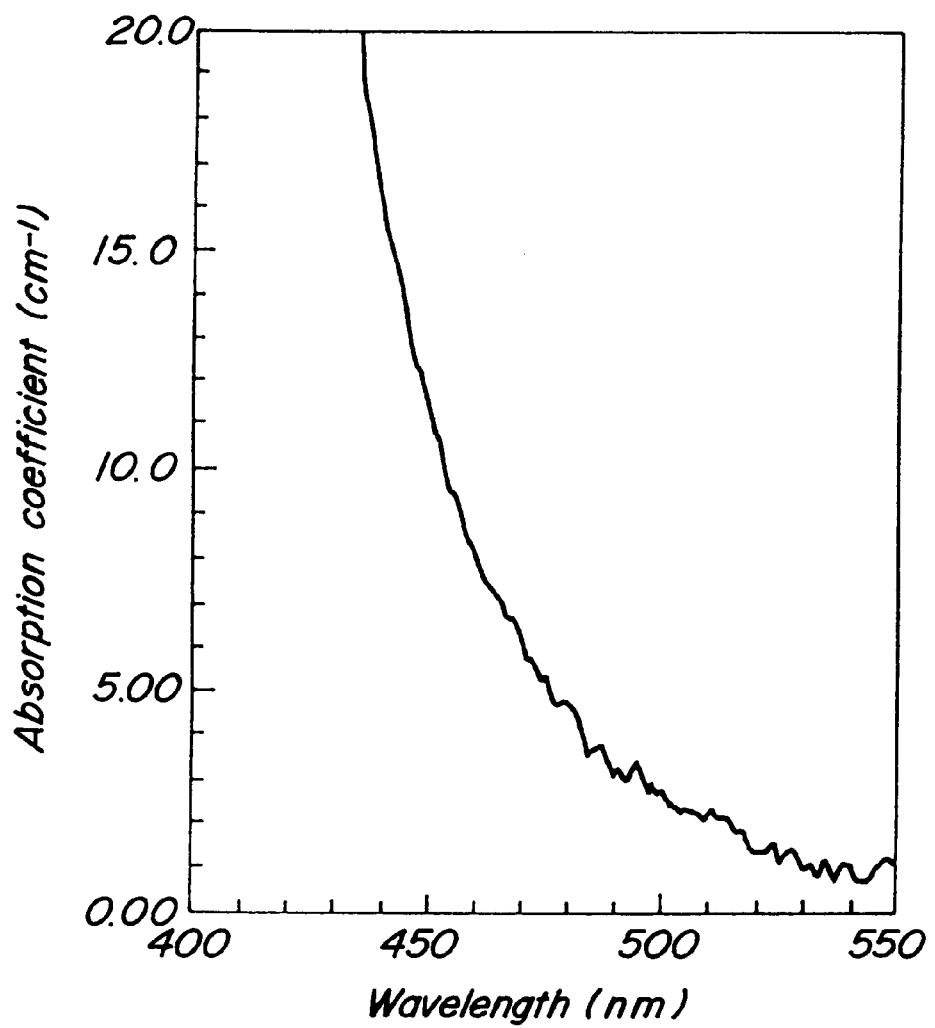
FIG. 1 is a graph showing a relation between an optical absorption coefficient and a wavelength with respect to a lithium niobate film manufactured by means of a liquid phase epitaxial process.
Figure 2:
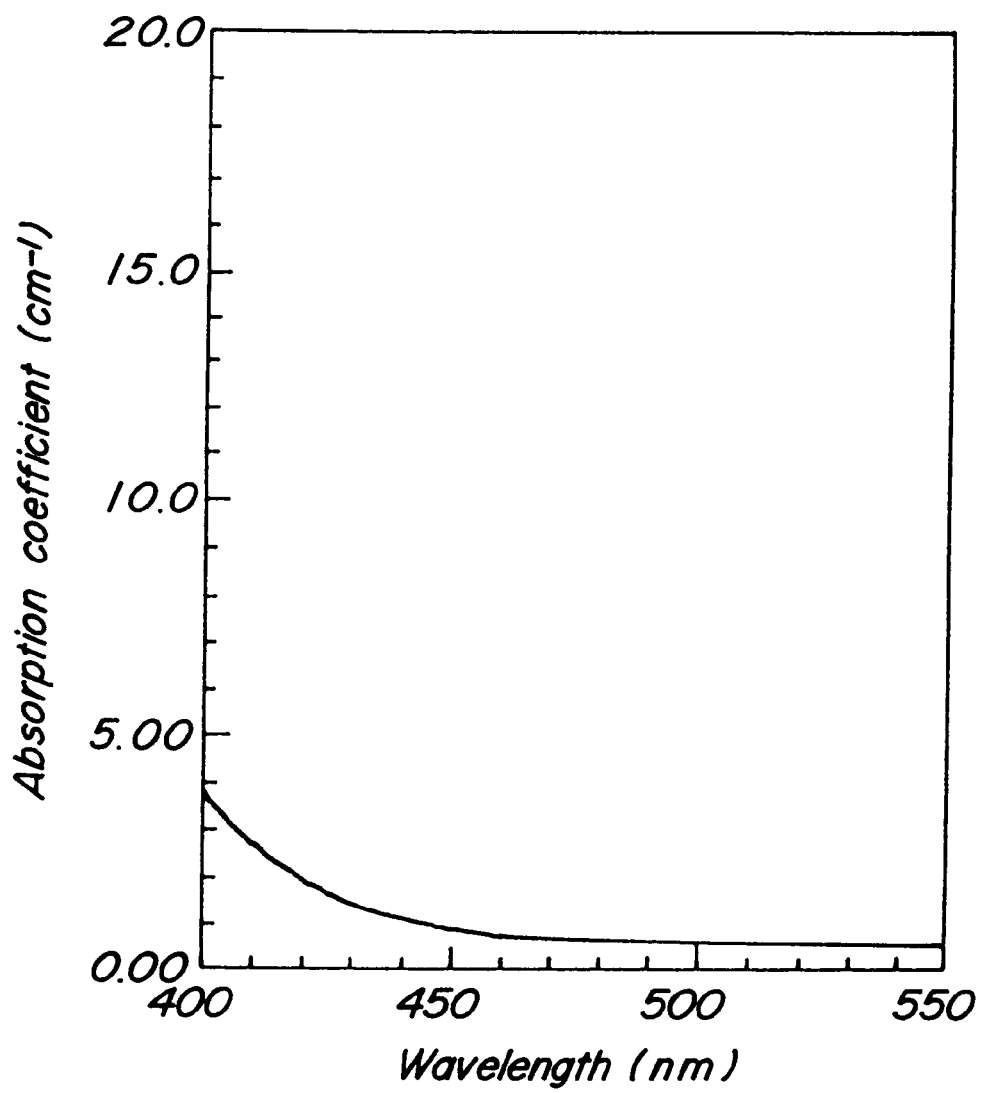
FIG. 2 is a graph showing a relation between an optical absorption coefficient and a wavelength with respect to a lithium niobate film of FIG. 1, after ozone-annealing at 600° C. according to Example 1 of the invention.

As shown in Table 1, the annealing temperature was changed from 300° C. to 1000° C., an optical absorption spectrum of lithium niobate film treated at each temperature was measured and then changes of optical absorption characteristics in the blue light range of 400–500 nm wavelengths were examined. In FIG. 1, optical absorption coefficients at 400–550 nm wavelengths before the ozone annealing treatment were shown. In FIG. 2, optical absorption coefficients at 400–550 nm wavelengths with respect to the sample treated at 600° C. in Table 1 were shown.

Furthermore, in Table 1, as an index representing the optical absorption characteristics in a blue light range of 400–500 nm wavelengths, the optical absorption coefficient at 450 nm wavelength was shown and compared.

TABLE 1

| Annealing temperature (° C.) | Optical absorption coefficient (cm − 1) |
| --- | --- |
| 300 | 10.4 |
| 400 | 10.3 |
| 500 | 1.1 |
| 600 | 0.9 |
| 700 | 1.0 |
| 800 | 3.2 |
| 900 | 4.7 |
| 1000 | 12.9 |

As seen from Table 1, by the ozone annealing treatment within a range of 500° C. to 900° C., the optical absorption coefficient for a light of 450 nm wavelength is extremely decreased. Particularly, it is found that by making the annealing temperature within a range of between 500° C. and 700° C., a film with an optical absorption coefficient of about 1 $cm^{-1}$ can be obtained. This value corresponds to about 4 B/cm as an optical propagation loss, which is extremely low for practically usable films. This represents a great technical stride in this art.

EXAMPLE 2

In the same manner as Example 1, a lithium niobate film was formed on a lithium niobate single crystal by means of a liquid phase epitaxial process. The thus manufactured film was subjected to an ozone annealing treatment according to the following procedures.

The sample was set in an electric furnace at room temperature. Then, while nitrogen which contains water vapor in a concentration of 3% by volume was run into the electric furnace, the temperature was increased up to each of the predetermined annealing temperatures shown in Table 2 at a temperature-increasing rate of 300° C./hour. When the temperature had reached a predetermined temperature, the gas running into the furnace was changed to oxygen which contained about 4% by volume of ozone and was dried to contain water vapor in a concentration of 0.1% by volume. Then the annealing treatment was conducted in the ozonic atmosphere for three hours. Next, after changing to nitrogen which contained water vapor in a concentration of about 3% by volume, the sample was cooled to room temperature at a temperature-decreasing rate of 300° C./hour.

Figure 3:
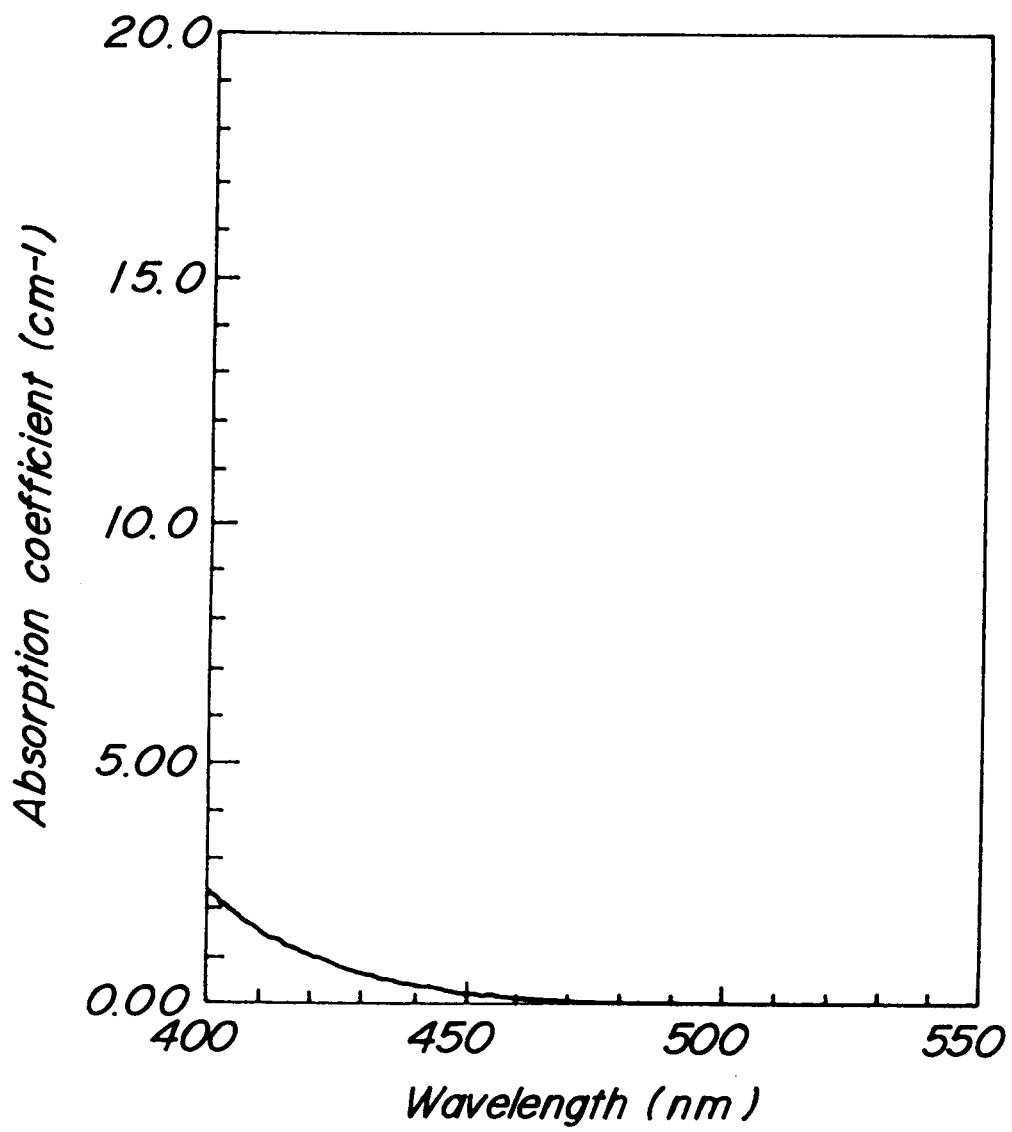
FIG. 3 is a graph showing a relation between an optical absorption coefficient and a wavelength with respect to a lithium niobate film of FIG. 1, after ozone-annealing at 600° C. according to Example 2 of the invention.

As shown in Table 2, the annealing temperature was changed from 300° C. to 1000° C., an optical absorption spectrum of the lithium niobate film treated at each temperature was measured and then changes of optical absorption characteristics in blue light range of 400–500 nm wavelengths were examined. In FIG. 3, optical absorption coefficients at 400–550 nm wavelengths with respect to the sample treated at 600° C. in Table 2 were shown.

Furthermore, in Table 2, as an index representing the optical absorption characteristics in blue light range of 400–500 nm wavelengths, an optical absorption coefficient at a 450 nm wavelength was shown and compared.

TABLE 2

| Annealing temperature (° C.) | Optical absorption coefficient (cm − 1) |
| --- | --- |
| 300 | 10.3 |
| 400 | 10.3 |
| 500 | 0.6 |

TABLE 2-continued

| Annealing temperature (° C.) | Optical absorption coefficient (cm − 1) |
|---|---|
| 600 | 0.2 |
| 700 | 0.2 |
| 800 | 0.5 |
| 900 | 3.1 |
| 1000 | 5.6 |

As seen from Table 2, by the ozone annealing treatment within a range of 500° C. to 900° C., an optical absorption coefficient for a light of 450 nm wavelength is extremely decreased. Particularly, it is found that by making the annealing temperature within a range of between 500° C. and 800° C., a film with an optical absorption coefficient of 0.6 cm$^{-1}$ or less can be obtained. Furthermore, by making the annealing temperature within a range of between 600° C. and 700° C., a film with an extremely low propagation loss, namely, with an optical absorption coefficient for a light of 450 nm wavelength of about 0.2 cm$^{-1}$ can be obtained. This corresponds to about 0.9 dB/cm as an optical propagation loss.

Such remarkable functions and effects are attributable to the use of a substantially ozone-free atmosphere and in addition a relatively high water vapor concentration, in the temperature-increasing and/or decreasing steps according to the present invention.

COMPARATIVE EXAMPLE 1

The lithium niobate membrane manufactured in the same manner as Example 1 was subjected to an annealing treatment in the following conditions The sample was set in an electric furnace at room temperature. Then, while oxygen containing about 4% by volume of ozone and dried to a water vapor concentration of 0.01% by volume was run into the electric furnace, the temperature was increased to each of the predetermined annealing temperatures shown in Table 3 at a temperature-increasing rate of 300° C./hour. The each predetermined temperature was kept for three hours and then cooled to room temperature at a temperature-decreasing rate of 300° C./hour.

Figure 4:
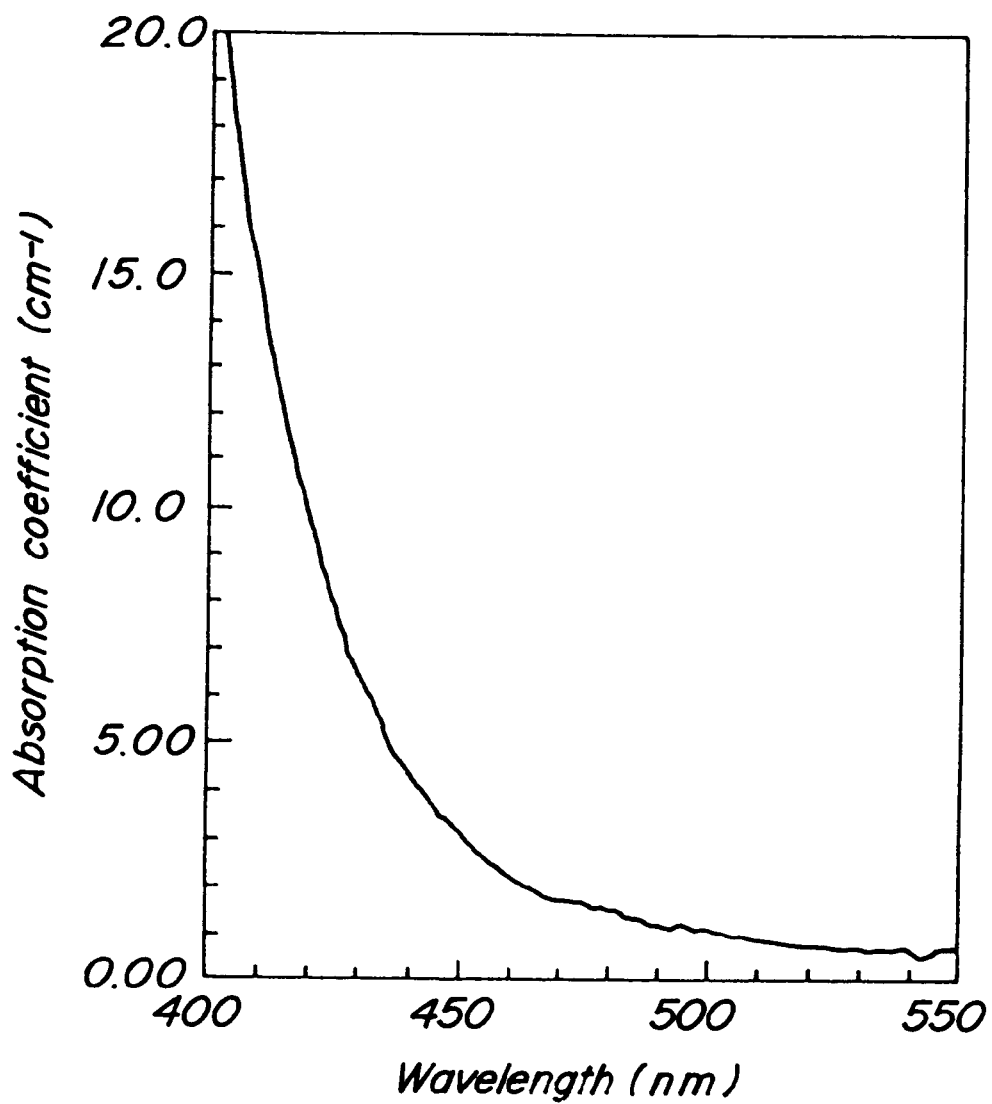
FIG. 4 is a graph showing a relation between an optical absorption coefficient and a wavelength with respect to a lithium niobate film of FIG. 1, after ozone-annealing at 600° C. according to Comparative Example 1.

As shown in Table 3, the annealing temperature was changed from 300° C. to 1000° C., an optical absorption spectrum of the lithium niobate film treated at each temperature was measured and changes of optical absorption characteristics in blue light range of 400–500 nm wavelengths were examined. In FIG. 4, optical absorption coefficients at 400–550 nm wavelengths with respect to the sample treated at 600° C. in Table 3 were shown.

Furthermore, in Table 3, as an index representing the optical absorption characteristics in a blue light range of 400–500 nm wavelengths, the optical absorption coefficient at a 450 nm wavelength was shown and compared.

TABLE 3

| Annealing temperature (° C.) | Optical absorption coefficient (cm − 1) |
|---|---|
| 300 | 10.4 |
| 400 | 10.3 |

TABLE 3-continued

| Annealing temperature (° C.) | Optical absorption coefficient (cm − 1) |
|---|---|
| 500 | 4.6 |
| 600 | 3.1 |
| 700 | 3.0 |
| 800 | 9.6 |
| 900 | 12.8 |
| 1000 | 13.3 |

As seen from Table 3, by the ozone annealing treatment within a range of 500° C. to 700° C., the optical absorption coefficient is decreased but still on a level of at least 3.0 cm$^{-1}$. As mentioned above, according to the present invention it is apparent that the optical absorption coefficient for a light of 450 nm wavelength is extremely decreased.

As mentioned above, according to the present invention, in an optical single crystal film produced by means of a liquid phase epitaxial process from a melt containing a transition metal, an optical absorption coefficient for lights of wavelengths in a wide range can be decreased, particularly, the optical absorption coefficient for the light of blue optical range of 400–500nm wavelengths can be extremely decreased.

What is claimed is:

1. A process for manufacturing an optical single crystal film on a single crystal substrate which comprises the steps of:

liquid phase epitaxial growing an optical single crystal epitaxial film from a melt containing a transition metal on a single crystal substrate;

increasing a temperature of the epitaxial film up to an annealing temperature;

annealing said epitaxial film at said annealing temperature in an atmosphere which contains ozone; and decreasing the temperature of the epitaxial film from said annealing temperature;

wherein said epitaxial film is exposed to an atmosphere substantially free from ozone during at least one of the increasing and decreasing steps.

2. The process according to claim 1, wherein said transition metal is vanadium.

3. The process according to claim 1, wherein said melt contains a combination of $V_2O_5$ and $Li_2 O$ as main ingredients and said optical single crystal film has an optical absorption coefficient at a 450 nm wavelength of not more than 2.0 cm$^{-1}$.

4. The process according to claim 1, wherein said atmosphere substantially free from ozone has a water vapor concentration of 0.01 to 5.0% by volume.

5. The process according to claim 1, wherein said atmosphere which contains ozone has a water vapor concentration of 0.01 to 5.0% by volume.

6. The process according to claim 1, wherein said atmosphere which contains ozone has a water vapor concentration less than the atmosphere substantially free from ozone.

* * * * *